United States Patent
Bannikov et al.

(10) Patent No.: US 11,220,894 B2
(45) Date of Patent: Jan. 11, 2022

(54) METHOD FOR TREATING FRACTURED SUBTERRANEAN FORMATIONS WITH CONTROLLED SOLIDS SETTING IN WELLBORE

(71) Applicant: SCHLUMBERGER TECHNOLOGY CORPORATION, Sugar Land, TX (US)

(72) Inventors: Denis Viktorovich Bannikov, Novosibirsk (RU); Vadim Ismailovich Isaev, Novosibirsk (RU); Aleksandra Mikhailovna Khudorozhkova, Novosibirsk (RU); Dmitry Sergeevich Kuznetsov, Novosibirsk (RU); Alexey Alexandrovich Tikhonov, Novosibirsk (RU)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 16/302,424

(22) PCT Filed: May 16, 2016

(86) PCT No.: PCT/RU2016/000290
§ 371 (c)(1),
(2) Date: Nov. 16, 2018

(87) PCT Pub. No.: WO2017/200412
PCT Pub. Date: Nov. 23, 2017

(65) Prior Publication Data
US 2019/0277123 A1    Sep. 12, 2019

(51) Int. Cl.
*E21B 43/26* (2006.01)
*C09K 8/68* (2006.01)
(Continued)

(52) U.S. Cl.
CPC .............. *E21B 43/26* (2013.01); *C09K 8/602* (2013.01); *C09K 8/68* (2013.01); *E21B 43/267* (2013.01);
(Continued)

(58) Field of Classification Search
None
See application file for complete search history.

(56) References Cited

U.S. PATENT DOCUMENTS 5,551,516 A * 9/1996 Norman ................. E21B 43/267
166/308.2
7,318,013 B2   1/2008 Guo et al.
(Continued)

FOREIGN PATENT DOCUMENTS

WO   2016069322 A1   5/2016

OTHER PUBLICATIONS

Helms "Horizontal Drilling" DMR Newsletter vol. 35. No. 1, 2008.*
(Continued)

*Primary Examiner* — Charles R Nold

(57) ABSTRACT

Methods may include using geometrical and mechanical properties to generate a model of one or more intervals of a wellbore; designing a fluid pumping schedule for a wellbore treatment fluid system; simulating flow of a fluid system containing solids using the model of the one or more intervals of the wellbore, wherein simulating comprises determining the flow rate distribution within the wellbore and modeling the settling and resuspension of the solids within the flow of the fluid system; and updating the fluid pumping schedule based on the output determined from the simulated flow of the fluid system. Methods may also include determining the critical velocity of the fluid system for various concentrations of one or more of solids and
(Continued)

additives; and selecting the concentration of the one or more of solids and additives based on the critical velocities determined.

17 Claims, 12 Drawing Sheets

(51) Int. Cl.
    *G01V 1/28*     (2006.01)
    *C09K 8/60*     (2006.01)
    *E21B 43/267*     (2006.01)
    *G06F 30/20*     (2020.01)
    *C09K 8/90*     (2006.01)

(52) U.S. Cl.
    CPC .............. *G01V 1/282* (2013.01); *G06F 30/20* (2020.01); *C09K 8/90* (2013.01); *C09K 2208/08* (2013.01); *C09K 2208/30* (2013.01); *G01V 2210/663* (2013.01)

(56) References Cited

U.S. PATENT DOCUMENTS

| | | |
|---|---|---|
| 7,580,796 B2 | 8/2009 | Soliman et al. |
| 2005/0115711 A1* | 6/2005 | Williams .............. E21B 43/267 |
| | | 166/308.1 |
| 2006/0054324 A1 | 3/2006 | Sullivan et al. |
| 2009/0037112 A1* | 2/2009 | Soliman .................. E21B 43/14 |
| | | 702/11 |
| 2014/0372089 A1 | 12/2014 | Weng et al. |

OTHER PUBLICATIONS

Zhang, J., Computational Fluid Dynamics (CFD) modeling of proppant transport in a plug-and-perf completion with different perforating phasing. (2014). Masters Theses. Paper 7285, 80 pages.
Ibarra et al., Critical Sand Deposition Velocity in Horizontal Stratified Flow, SPE 168209, SPE International Symposium and Exhibition on Formation Damage Control, Feb. 26-28, 2014, 13 pages.
Soepyan, F.B., et al. "Selection of the Optimal Critical Velocity for Sand Transport at Low Concentrations for Near-Horizontal Flow". 2012, OTC 23075. Houston, Texas, 7 pages.
Wutherich et al., Designing Completions in Horizontal Shale Gas Well: Perforation Strategies, SPE 155485, Americas Unconventional Resources Conference, Jun. 5-7, 2012; 10 pages.
Brannon et al., Eliminating Slickwater Compromises for Improved Shale Stimulation, SPE 147485, SPE Annual Technical Conference and Exhibition, Oct. 30-Nov. 2, 2011, 11 pages.
International Search Report and Written Opinion issued in International Patent Appl. No. PCT/RU2016/000290 dated Feb. 27, 2017; 6 pages.

* cited by examiner

METHOD FOR TREATING FRACTURED SUBTERRANEAN FORMATIONS WITH CONTROLLED SOLIDS SETTING IN WELLBORE

BACKGROUND

During fracturing operations in subterranean formations for the production of hydrocarbons, fractures are generated in a zone of interest by pumping a fluid at relatively high pressures that create and extend fractures in the rock. Induced formation fractures may then form channels that permit the return of hydrocarbon fluids to the wellbore. While pressurized fluids may be used for the fracturing process, injected fluids may also serve additional functions, including transporting particulate proppants that prevent the closure of induced and existing fractures. In order to adjust the solids transport properties of fracturing fluids, fluid pumping rates may be adjusted to increase transport capacity. Further, rheology may be modified using various viscosifiers and flow improvers that increase suspension capacity of the fracturing treatments and control the extent that fractures are propagated from the wellbore. Moreover, fracturing fluid design may also strike a balance between the requirements for the suspension properties for various solids and maintaining a fluid viscosity that is within the capacity of the pumping infrastructure at the well site.

SUMMARY

This summary is provided to introduce a selection of concepts that are described further below in the detailed description. This summary is not intended to identify key or essential features of the claimed subject matter, nor is it intended to be used as an aid in limiting the scope of the claimed subject matter.

In one aspect, embodiments of the present disclosure may be directed to methods that include using geometrical and mechanical properties to generate a model of at least one interval of a wellbore; designing a fluid pumping schedule for a wellbore treatment fluid system; simulating flow of a fluid system containing solids using the model of at least one interval of the wellbore, wherein simulating comprises determining the flow rate distribution within the wellbore and modeling the settling and resuspension of the solids within the flow of the fluid system; and updating the fluid pumping schedule based on the output determined from the simulated flow of the fluid system.

In another aspect, embodiments of the present disclosure may be directed to methods that include using geometrical and mechanical properties to generate a model of at least one interval of a wellbore; simulating flow of a fluid system containing at least one of solid and additive within at least one interval of a wellbore, wherein simulating comprises determining the flow rate distribution within the wellbore and modeling settling and resuspension of the solids within the fluid system; determining the critical velocity of the fluid system for various concentrations of at least one of solid and additive; and selecting the concentration of at least one of solid and additive based on the critical velocities determined.

Other aspects and advantages of the disclosure will be apparent from the following description and the appended claims.

DETAILED DESCRIPTION

Embodiments disclosed herein are directed to the design of treatment pumping schedules used to deliver fluids and solids into a wellbore with control over solid settling. In one or more embodiments, methods in accordance with the present disclosure may be used to design fracturing treatments and optimize delivery of proppant for operations in hydrocarbon-bearing formations. As used herein, "fracturing" and "fracturing treatment" may be used to refer to types of fracturing operations, including the initial fracturing of one or more intervals in a wellbore, the treatment of existing fractures, and refracturing operations.

Figure 1:
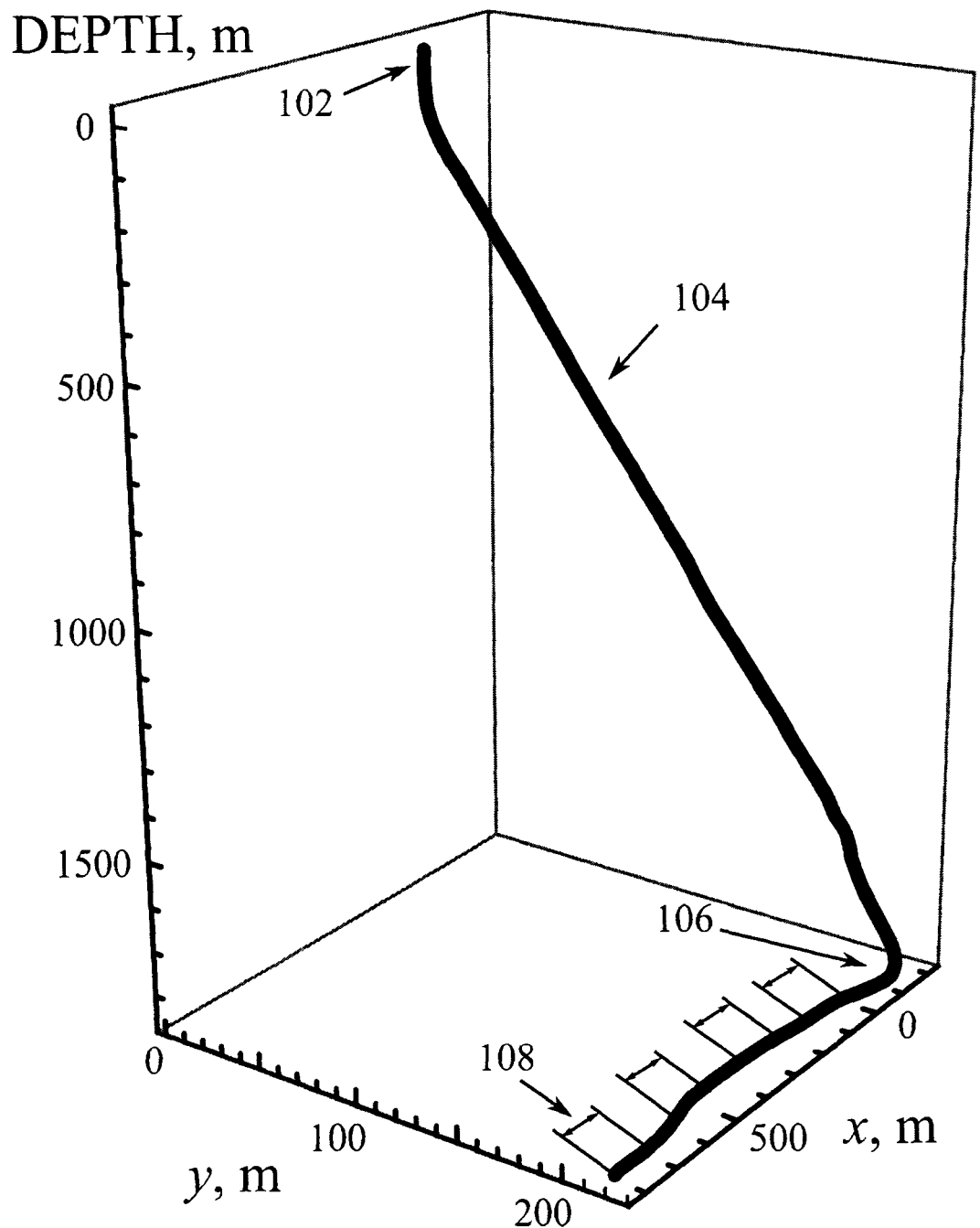
FIG. 1 is an illustration of a fracturing operation in a deviated wellbore in accordance with embodiments of the present disclosure.

Multi-stage hydraulic fracturing technology may be used for commercial hydrocarbons production in unconventional resources to increase cumulative production and life-time of the well without drilling new wells. In addition, refracturing techniques may be employed in primary and secondary recovery operations to increase hydrocarbon production. Hydrocarbon extraction from a reservoir may involve injecting treatment fluids containing specialized additives such as proppants that are transported through the horizontal sections of a wellbore and delivered to identified intervals (or clusters) to prop open formation fractures created or reopened by the force exerted from the injected fluids. With particular respect to FIG. 1, a representation of a deviated wellbore that has undergone a fracturing treatment is shown.

The well extends from wellhead 102 along wellbore 104 to a horizontal section 106 containing several perforated intervals 108.

During fracturing operations, flow rates may approach zero as injected fluids distribute among one or more clusters and into the fracture network, despite high rates of fluid delivery. Leak off of fluids into fracture in the formation may lead to the accumulation of solid particles at various intervals in the wellbore and the formation of blockages and plugs in some cases. Low flow rates and poor rheology of the transport fluid may make delivery of treatment fluids and solids to distant clusters and at long horizontal distances unmanageable.

Maintaining flow rates above a critical flow rate threshold, the rate at which solids begin to settle out and accumulate, or the "critical velocity," becomes substantial factor in the design of treatment pumping schedules. For example, reduced fluid rates are design considerations for refracturing operations in which one or more intervals within the wellbore are perforated and connected to a large number of fractures created by the first fracturing treatment and considerable fluid loss and diversion is expected.

Methods in accordance with the present disclosure include the design of fluid treatments and pumping schedules that minimize the risk of solids settling and generation of barriers to adequate wellbore flow and plugging. In some embodiments, methods may include multi-stage fracturing and/or refracturing operations that control and/or minimize the settling of solids in a wellbore.

In one or more embodiments, the design of fluid treatments may include generating one or more models describing multicomponent slurry flow in a wellbore. Models in accordance with the present disclosure may provide measures for preventing solids settling that may include: pumping rate adjustments that ensure that the flow velocity is high enough to reduce settling; the addition of viscosifying agents to injected fluids; the addition of insoluble materials; and energizing the fluid with a gaseous phase such as nitrogen and carbon dioxide.

The following section describes an example of a workflow in accordance with the present disclosure that may be used to generate an optimized fluid treatment pumping schedule.

Treatment Design Workflow

Figure 2:
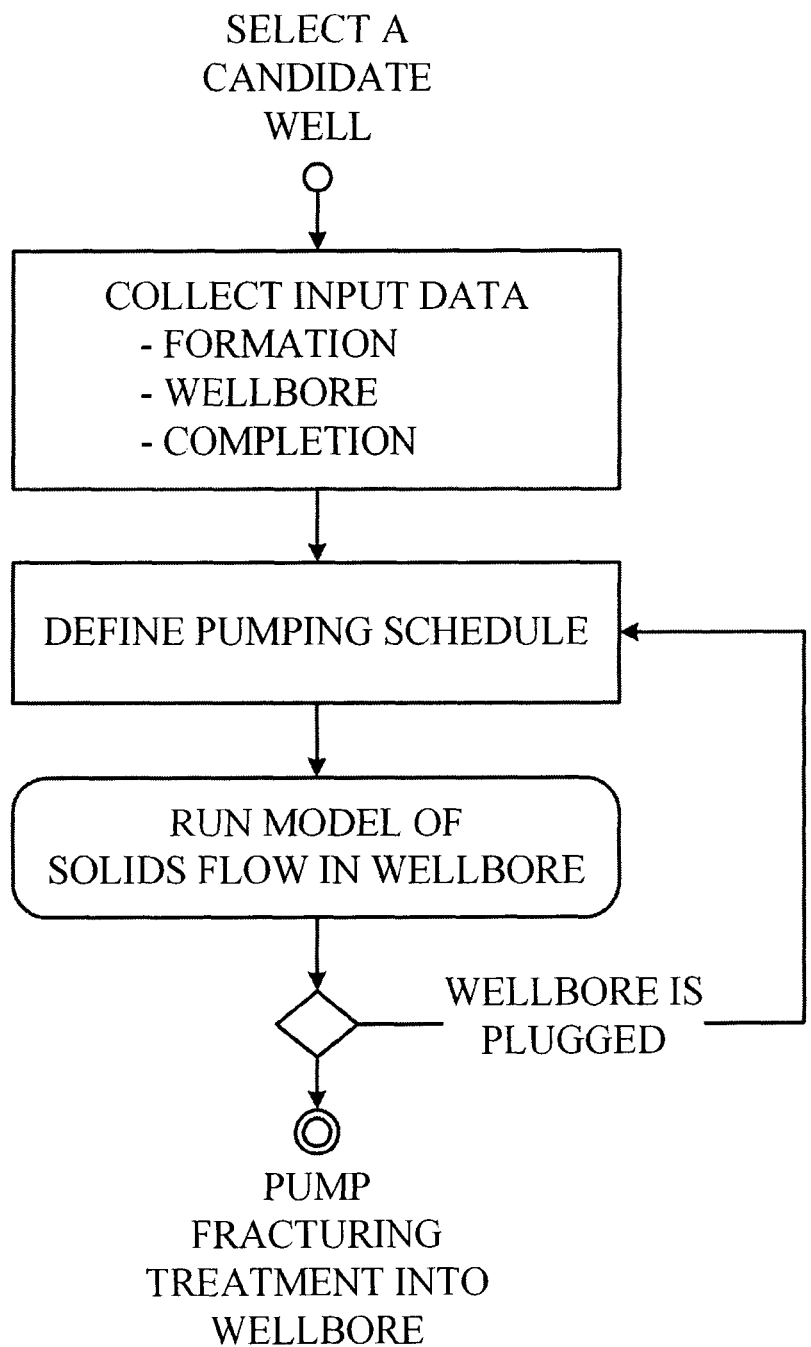
FIG. 2 is a schematic depicting a workflow for developing a wellbore treatment in accordance with embodiments of the present disclosure.

Methods in accordance with the present disclosure may incorporate a workflow to design a wellbore treatment. With particular respect to FIG. 2, a workflow of a method in accordance with the present disclosure is shown. Methods may begin at 202 by selecting a candidate well, then proceeding to 204 to collect input data regarding the formation, wellbore, and any applied completion stages. At 206, a pumping schedule is defined based on the input criteria and used to execute a model of solids flow in the wellbore at 208. In the event that the model indicates that wellbore plugging may occur, stages 206 and 208 may be iteratively performed at 212 to minimize the possibility of formation damage. Once a satisfactory pumping schedule is designed, the treatment is then injected into the wellbore. In one or more embodiments, methods in accordance with the present disclosure may generate a pumping schedule as an output, which may include a sequence of pumping stages characterized by one or more of pumping rate, time or duration, fluid components such as fluids and solids, and the respective concentration of the fluid components.

Pumping schedules generated may minimize the risk of negative outcomes during fracturing and refracturing operations such as wellbore plugging. Methods in accordance with the present disclosure may also be used as a part of workflow for multi-criteria optimization operations such as production simulation and calculation of net present value of a selected reservoir. In some embodiments, risk assessments may be based on simulation results obtained in a model of slurry flow in the wellbore.

Models in accordance with the present disclosure may be described as lists of input and output parameters that are discussed in further detail below.

Input Data

Inputs for models may include a pumping schedule that incorporates a list of stages characterized by fluid pumping rate and time, and concentrations of fluid components. Other model inputs include geometrical and mechanical properties of the wellbore and piping in contact with the pumped fluids. Geometrical properties may include hole diameter, interval lengths, depth, spatial orientation, and the like. Relevant mechanical properties may include standard geological and/or mechanical characterizations such as stresses, Young's modulus, Poisson's ratio, and the like.

Other model inputs include structural descriptors of the wellbore and downhole equipment in previously fractured or unconsolidated formations, which may include properties of perforated intervals such as cluster spacing, perforation diameters, perforation numbers, and the like. Models in accordance with the present disclosure may also account for properties of various fluid components of the anticipated fluid to be injected such as properties of any solids including mean particle diameter, specific gravity, overall particle geometry, and the like; and properties of fluids such as rheology, additive content, specific gravity, temperature, and the like.

Output Data

Models in accordance with the present disclosure may generate one or more outputs that may be used to generate a final pumping schedule. In one or more embodiments, outputs may include the cross-sectional area occupied by solids precipitated from an injected fluid, such as solid particle bed height, at each point of wellbore trajectory, and may also include the flow rates at each point of a wellbore trajectory and at all perforations. In some embodiments, models may calculate the defined as the critical velocity of a given fluid system, which is defined as the flow velocity below which the solids settle forming a bank at the wellbore bottom. Models in accordance with the present disclosure may also be constructed to account for the coupled problems of calculating flow rates distribution, and modeling of solids settling and resuspension.

In one or more embodiments, construction of models that indicate conditions within the wellbore and/or during simulated fluid flow may involve the use of 3D modeling techniques. For example, models and simulations of inflow into fractures may involve the use of Khristianovich-Geertsma-de Klerk (KGD), Perkins-Kern-Nordgren (PKN), radial, pseudo 3D, planar 3D, or full 3D approaches. Simulation of proppant transport may involve the use of commercially available software packages such as ANSYS® CFD or Star-CCM+.

In one or more embodiments, fluid treatments in accordance with the present disclosure may mitigate solids settling through a number of mechanisms including adjusting pumping rates of fluids into the wellbore and incorporating various additives into injected treatment fluids. Each of these mechanisms will be discussed in turn below.

Pumping Rate Adjustment

Figure 3:
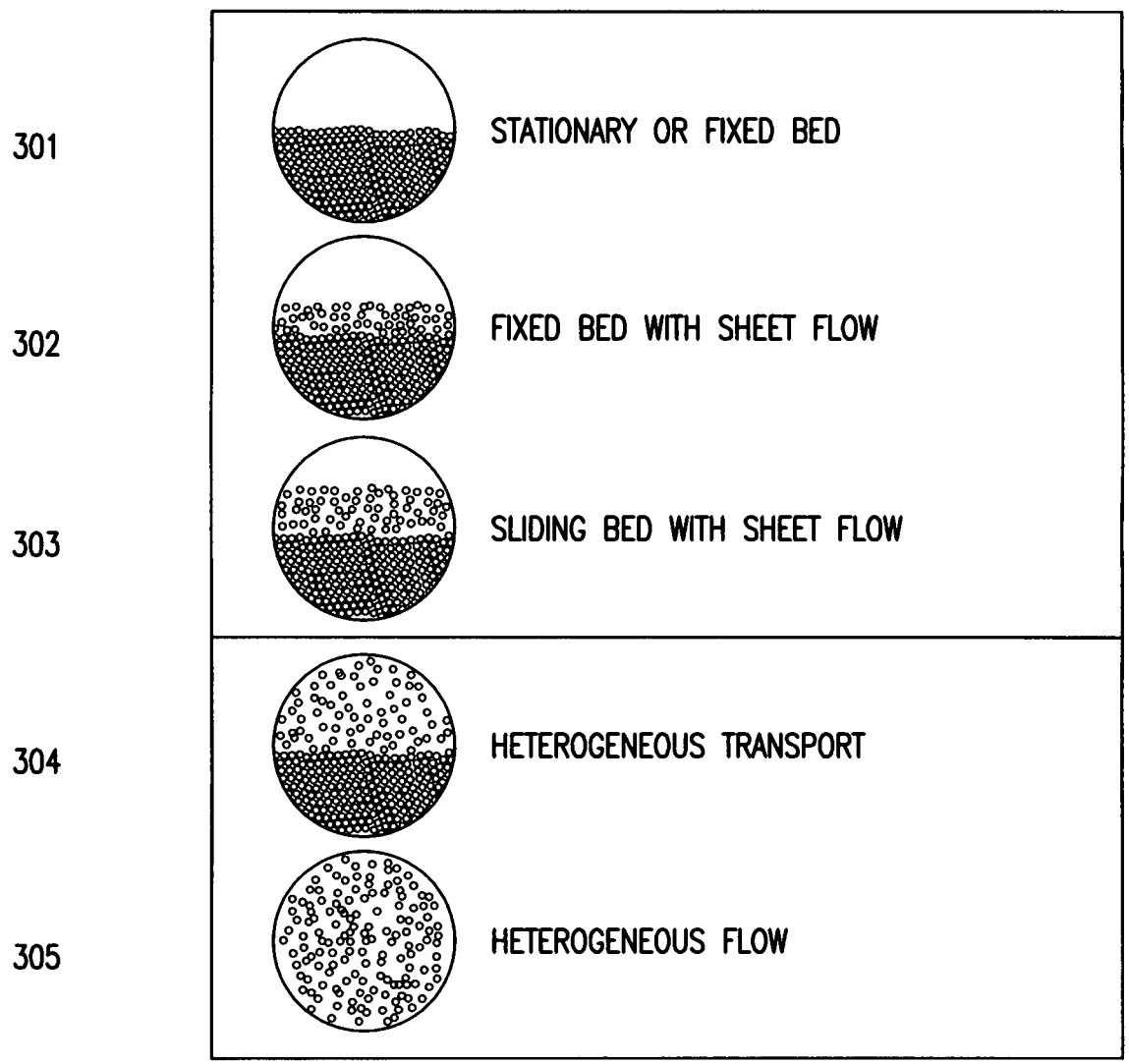
FIG. 3 is an illustration depicting a number of flow regimes possible for a fluid transporting solids in accordance with embodiments of the present disclosure.

Methods in accordance with the present disclosure may incorporate one or more multicomponent slurry flow models to calculate the pumping rate in one or more stages of a fluid treatment pumping schedule. During fluid flow, a slurry composition containing solids may undergo various stages of solids transport. With particular respect to FIG. 3, various flow regimes of solids in a fluid flow are shown. Flow regimes that may be encountered may range from (301) stationary or fixed bed flow in which solids have deposited from the slurry, (302) fixed bed with sheet flow, and (303) sliding bed with sheet flow, to regimes with mobile solids transport such as (304) heterogeneous transport and (305) homogenous flow.

In some embodiments, decreasing fluid flow velocity may alter the flow of a solids-containing fluid from a heterogeneous flow to "sliding bed" flow regime. To avoid this phenomenon, transition velocity may be held at a rate higher than the critical velocity. Flow models used to determine critical velocity include Turian's model as shown in Eq. 1, where $V_{crit}$ is the critical velocity, $\varphi$ is the volume fraction of solids in the flow, $d_p$ is the particle diameter, D is the pipe diameter, s is the ratio of solid density to fluid density, $\mu$ is the viscosity of the fluid, and $\rho$ is particle density.

$$V_{crit} = 1.85 \varphi^{0.1536} (1-\varphi)^{0.3564} \qquad (1)$$
$$\left(\frac{d_p}{D}\right)^{-0.378} \frac{1}{\mu^{0.09}} \left[\rho \sqrt{gd_p(s-1)} D\right]^{0.09} \sqrt{gd_p(s-1)}$$

Turian model represented by Eq. 1 was created for Newtonian solid-laden fluids. For non-Newtonian fluids, no calibrated models currently exist. However, additives may be combined with the fluid system to shift the critical velocity to lower values.

Figure 4:
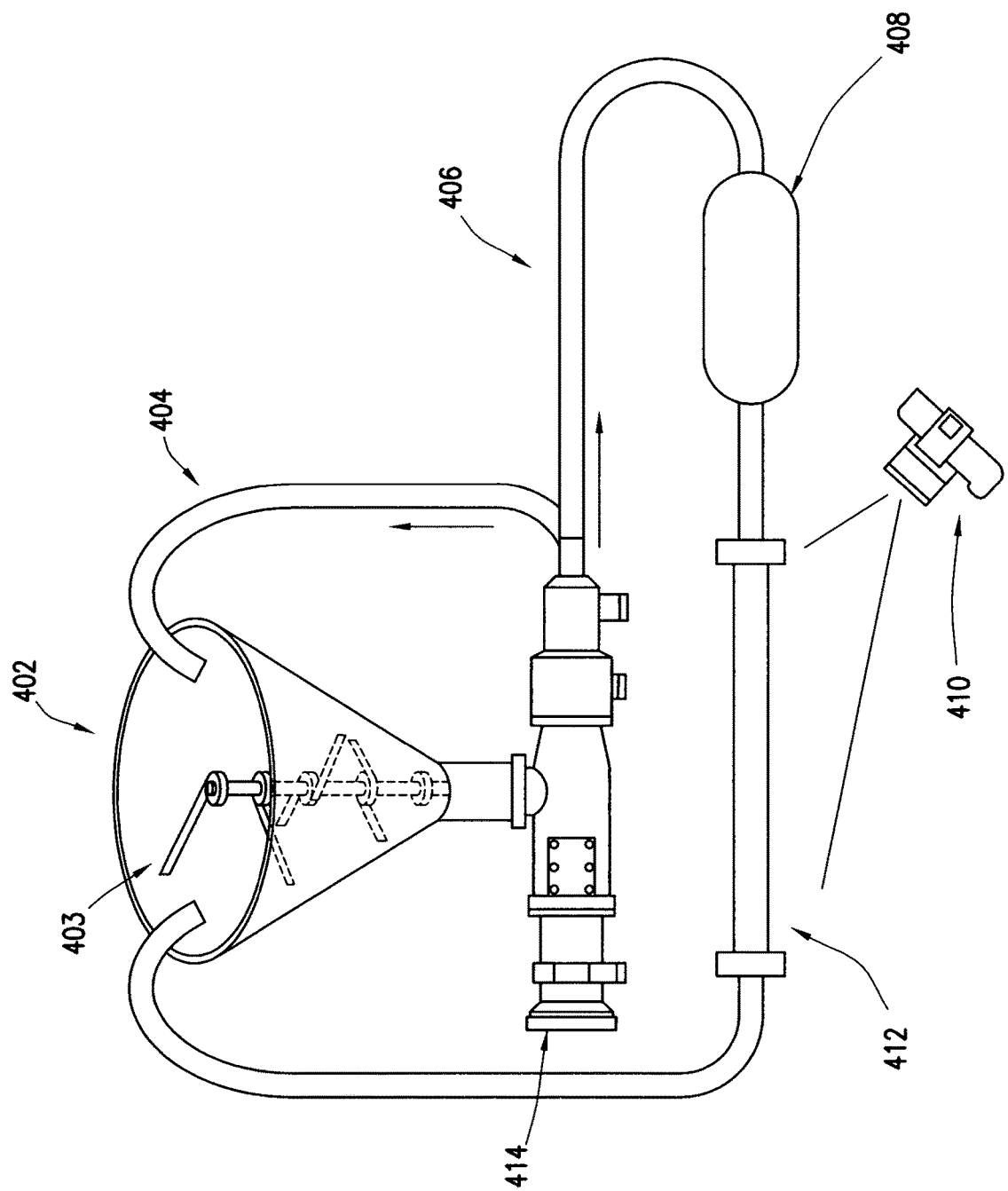
FIG. 4 is an illustration of a flow testing apparatus in accordance with embodiments of the present disclosure.

In one or more embodiments, the ability of different materials to decrease critical velocity may be determined empirically through testing of various additive concentrations using a flow loop apparatus or other similar testing device. In some embodiments, the critical velocity of various treatment fluids may be analyzed using a flow loop setup that combines fluids and solids and measures fluid flow and solids transport properties. With particular respect to FIG. 4, a pump 414 is used to drive a fluid and solids mixture from hopper 402, which may be equipped with mixer 403 in some embodiments, into the main line of the device 406. A by-pass line 404 may also be installed to redirect fluids driven from the pump 414 into the hopper 402. The main line 406 of the device may pass through a flow-meter 408 that measures the flow rate within the device. A section of transparent pipe 412 within the flow path may also be combined with a monitoring apparatus 410 such as a camera or spectrophotometer that monitors the flow and/or settling properties of solids.

In some embodiments, testing methods in accordance with the present disclosure may include mixing a fluid composition such as water, slickwater, or linear gels with the selected additives for 5 to 30 minutes in a hopper achieve the proper level of dispersion. During the dispersion stage, materials may be added to the fluid composition using the by-pass line 104. The hopper 402 may then be charged with one or more solids to achieve a final circulating concentration of 0.1 to 10 pounds of proppant added (ppa) in the pumped fluid. In some embodiments, testing runs may be performed with a solid additive concentration within the range of 5 to 10 ppa. The flow loop apparatus is then operated at a pumping regime that provides fluid flow approximating the critical velocity rate through the main line. The rate of fluid flow is then decreased incrementally and the critical rate at which sand begins to settle is recorded along with the height of any generated proppant dune.

In addition to measuring the critical velocity of the system, solids settling may be studied by a number of additional techniques that include calculating the velocity distribution along the lateral and amount of proppant occupying a given cluster. In order to validate critical velocity, methods in accordance with the present disclosure may incorporate a control run in which the fluid composition is circulated throughout the flow loop 406 without additives to establish a baseline critical velocity for a fluid system.

Figure 5:
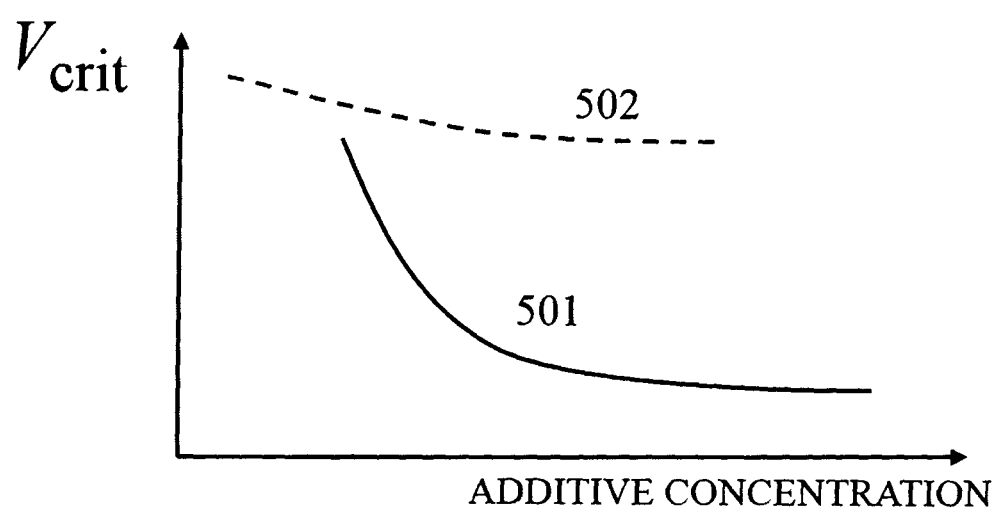
FIG. 5 is a graphical depiction of critical velocity of a fluid transporting solids as function of additive concentration in accordance with embodiments of the present disclosure.

In one or more embodiments, the concentration of additive that decreases the critical velocity of the fluid through the piping is determined and recorded. With particular respect to FIG. 5, a schematic diagram of critical velocity $V_{crit}$ as a function of additive concentration for two representative fluid system samples is shown. In the example denoted by the solid trace 501, a sample of fluid composition is tested with additive 1 and the plot region with the highest derivative with respect to concentration represents the most effective dosage of additive 1. In the example denoted by the dashed trace 502, a sample of the same fluid composition is assayed with varying concentration of additive 2.

During testing of a fluid system, the additive concentration, and effectively the critical velocity of the fluid, may then be adjusted using this method to fall within the desired operational parameters. The model is then executed with the newly determined critical velocity and estimates are generated for cross-sectional areas of the system that will experience solids settling. If the outcome is less than desired, the concentration of flow modifiers is altered or differing solid materials are selected, and the method is repeated until a satisfactory treatment composition and pumping schedule is generated.

Additive Materials

In one or more embodiments, additives that may be combined with fluids in accordance include solids and other materials that are often regarded as proppants. The geometry of additives may include materials such as fibers, slices, flakes, fines, colloidal particles, and pulps. Additive materials in accordance the present disclosure may have varying geometries including spherical, oblate, or fibrous and may vary in diameter (or length for materials having an asymmetrical aspect ratio) from 10 nm to 10 mm.

In some embodiments, additives may be rigid or flexible, straight or curved, and single or multi-component. Additives in accordance with the present disclosure may be be any material, such as comminuted plant materials, synthetic polymers such as polyester, polyaramide, polyamide, novoloid or novoloid-type polymers, fibrillated synthetic organic polymers, ceramics, inorganics, metals, carbon, glass, natural polymer, and mixtures thereof. In one or more embodiments, additives may include cellulose, polylactic acid polyester, polyglycolic acid polyester, polyvinyl alcohol, polyamide, and the like.

In one or more embodiments, fluid systems in accordance with the present disclosure may be modified using one or more viscosifying agents. Viscosifying agents may include polymers such as hydroxyethylcellulose, carboxymethylguar, carboxymethylhydroxypropyl guar, and various viscoelastic surfactants. In some embodiments, polymeric viscosifying agents may be applied to a fluid system as a linear additive or as crosslinked and/or graft polymers. Viscosifying additives may also include clays such as bentonite and attapulgite, or any combination thereof.

In one or more embodiments, flow models may be developed for various compositions of matter including fluids systems containing solids, polymers, or gasses. For example, fluid flow models may be applied to energized fluids such as foaming fluids and stabilized foamed fracturing fluids.

Modeling Fluid Flow and Solids Transport in the Formation

In one or more embodiments, methods in accordance with the present disclosure may incorporate one or more models of solids flow in a wellbore to design pumping schedules for fracturing treatments. In some embodiments, models may account for combinations of problems encountered in the design of pumping schedules, including the problems of (1) calculating flow rate distribution, and (2) modeling solids settling and resuspension. The selected problems will be discussed in turn in the following sections.

Problem 1: Calculation of Flow Rates Distribution

Figure 6:
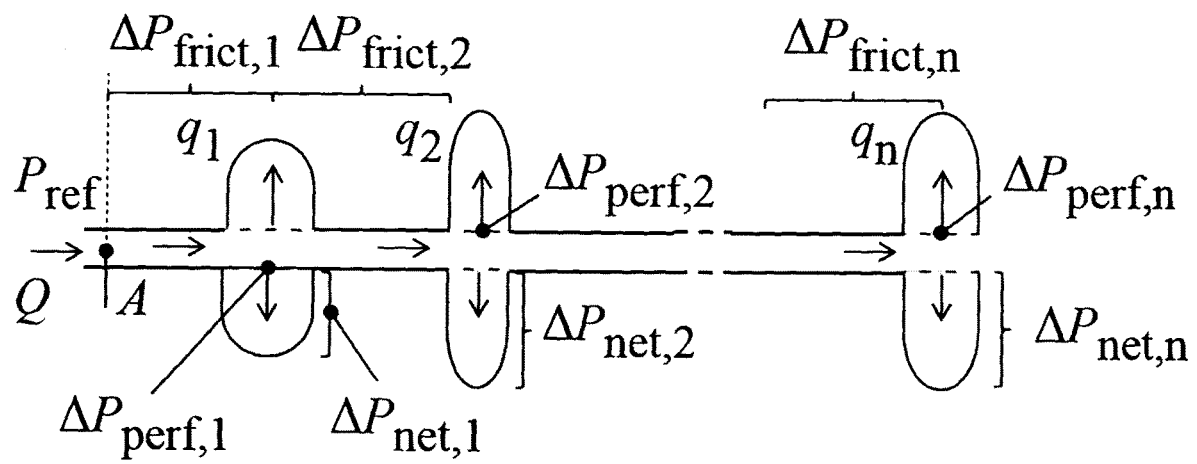
FIG. 6 is an illustration depicting a model of an interval of a wellbore with a number of fractures and the associated variables in accordance with embodiments of the present disclosure.

With particular respect to FIG. 6, a model of an idealized multilayer fracture treatment is shown in which fractures are generated in all perforated intervals. As fluid is injected an interval of a formation, total pumping rate Q may split among n fractures as fluids are pumped into the fractures. A sufficient pressure $P_{ref}$ is required to inject the slurry into the formation. Each fracture grows depending on the flow rate pumped into it and the structural properties of the surrounding formation.

In one or more embodiments, algorithms for designing fluid treatments may also account for other flow-modifying effects that may include casing friction, hydrostatic forces, perforation friction, and fracture presence. Other known pressure drops in the system may be added to the model in some embodiments.

The casing friction in a wellbore element may be determined in some embodiments by Eq. 2, where c is the friction pressure coefficient, d is the friction pressure constant, $q_{wb}$ is the flow rate contributed by the wellbore, and $\Delta L$ is the length of the wellbore element.

$$\Delta P_{frict} = c \cdot q_{WB}^d \cdot \Delta L \qquad (2)$$

The hydrostatic pressure drop is given by Eq. 3, where $\Delta z_i$ is the height difference between reference point A and an i-th perforated interval, g is the local acceleration due to gravity, and $\rho_{slurry}$ is the density of the slurry composition.

$$\Delta P_{hydr,i} = \rho_{slurry} \cdot g \cdot \Delta z_i \qquad (3)$$

The perforation friction is given by Eq. 4, where $q_i$ is the fluid flow into the i-th fracture, $m_i$ is the number of perforations at i-th cluster, $d_{perf}$ is the diameter of perforation, and $C_d$ is a dimensionless discharge coefficient.

$$\Delta P_{perf,i} = 0.81 \frac{q_i^2 \rho_{slurry}}{m_i^2 d_{perf}^4 C_d^2} \qquad (4)$$

Eqs. 2-4 couple an analytical model of a constant height PKN fracture to a set of equations describing conservation of slurry volume and pressure continuity. These equations provide coupling between multiple fractures via the wellbore. The net pressure corresponds to a Perkins-Kern-Nordgren (PKN) fracture for the zero leak-off case, where $v$ is Poisson's ratio, $\mu$ is the fluid viscosity, E is Young's modulus, h is the fracture height, and t is time since fracture initiation.

$$\Delta P_{net,i} = 2.5 \left( \frac{2(1-v^2)\mu q_{frac}^2}{Eh} t \right)^{1/5} \qquad (5)$$

Variable $q_{frac}$ is defined as shown in Eq. 6, wherein $q_i$ is the fluid flow into the i-th fracture.

$$q_{frac} = \frac{q_i}{2} \qquad (6)$$

While one example is shown above, any system simulating a hydraulic fracture could be used in methods in accordance with the present disclosure to calculate the net pressure caused by presence of the fracture.

One assumption in the above algorithm is the absence of fluid transfer between the fractures within the formation, which implies that the fractures are coupled through the wellbore. With this assumption the conservation of fluid volume may be described the equality shown in Eq. 7 stating that the total pumping rate Q is equal to the sum of each fluid flow into the i-th fracture $q_i$.

$$Q = \sum_{i=1}^{n} q_i \qquad (7)$$

Continuity of pressure implies that the sum of all pressure changes is equal to the reference pressure for any path connecting a fracture tip of the i-th fracture with the reference point A as described in Eq. 8 and as shown in FIG. 6.

$$P_{ref} = \sum_{k=1}^{i} \Delta P_{frick,k} + \Delta P_{perf,i} - \Delta P_{hydr,i}, i=1,n \qquad (8)$$

In one or more embodiments, the solution to the system of non-linear equations Eq. 7 and Eq. 8, where $q_i, \ldots, q_n$, $P_{ref}$ are unknowns, may be found by the application of a Newton-like method for nonlinear system of equations.

Problem 2: Modeling of Solids Settling and Resuspension

Figure 7:
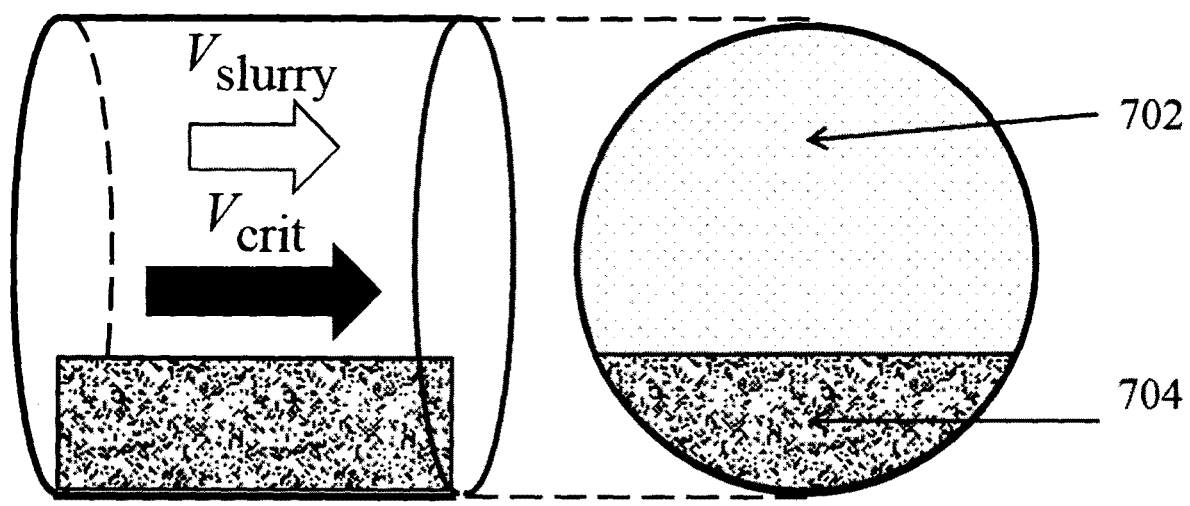
FIG. 7 is an illustration depicting slurry flow within an interval of a wellbore in accordance with embodiments of the present disclosure.

Another component of models in accordance with the present disclosure is modeling the process of solid suspension in fluid flows. In order to study the phenomenon, an experimental flow loop is constructed from a horizontal pipe with n perforated intervals, which allow for fluid communication with a formation. The flow of slurry in the wellbore splits in multiple streams, an immobile bank 704 and a flowing slurry 702, as shown in FIG. 7.

From this model, the average slurry velocity may be calculated as shown in Eq. 9, where $V_{slurry}$ is the velocity of the slurry, $q_{wb}$ is the flow rate in the wellbore element, $S_{pipe}$ is the cross-sectional area of the pipe, and $S_{bank}$ is the cross-sectional area of the bank created by solids settling.

$$V_{slurry} = \frac{q_{WB}}{S_{pipe} - S_{bank}} \qquad (9)$$

In one or more embodiments, bank area $S_{bank}$ may be calculated by determining if $V_{slurry}$ is greater than the minimal transport velocity $V_1$, at which point $S_{bank}$ may be assumed to be zero. If $V_{slurry}$ is less than $V_1$, the area of bank may increase until $V_{slurry}$ is equivalent to $V_t$, which may be described by Eq. 10.

$$S_{bank} = S_{pipe} - \frac{q_{WB}}{\max(V_{slurry}, V_t)} \qquad (10)$$

In one or more embodiments, Eqs. 11 and 12 may be used to calculate the minimum flow rate required to transport solid particles. In some embodiments, the velocity of course particles in a fluid system may be described by the Durand equation as shown in Eq. 11, where $V_{Durand}$ is the minimum transport velocity, F is an empirical constant that varies between 0.4 and 1.5, s is the ratio of the densities of the particle component and the fluid component, g is the acceleration due to gravity, and D is the wellbore diameter.

$$V_{Durand} = F\sqrt{2 \cdot g \cdot (s-1) \cdot D} \quad (11)$$

The Wasp equation shown in Eq. 12 may also be used as a correction to Eq. 11 that takes into account the particles' size, where $d_p$ is the diameter of the solid particles.

$$V_{Wasp} = F\sqrt{2 \cdot g \cdot (s-1) \cdot D} \cdot (d_p)^{1/6} \quad (12)$$

Figure 8:
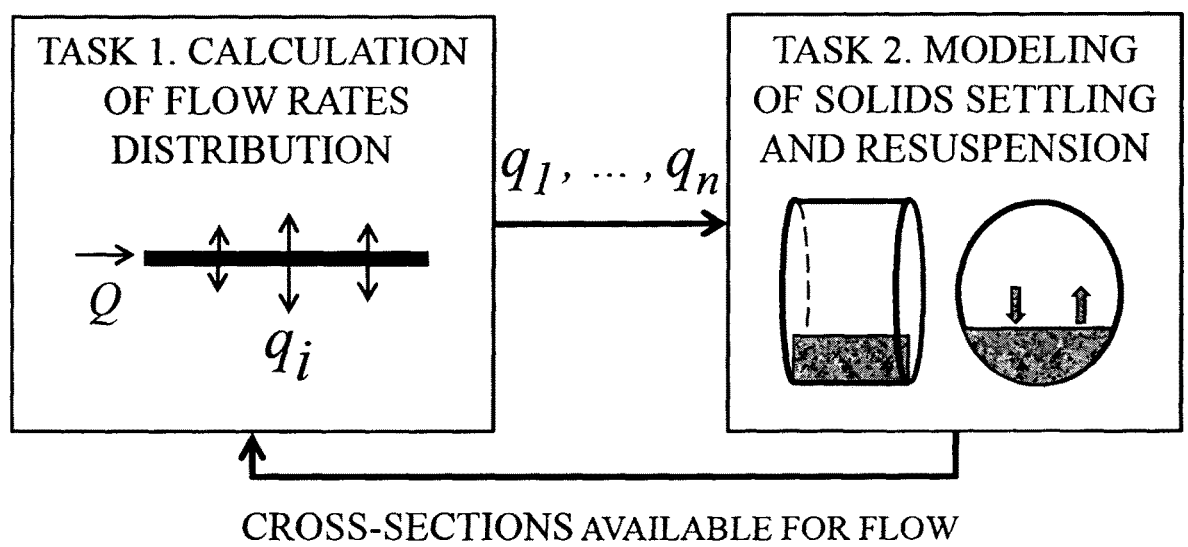
FIG. 8 is an illustration depicting an iterative process of modeling flow rate distribution in a fractured interval and solids settling and resuspension in accordance with embodiments of the present disclosure.

In one or more embodiments, the problems of flow rate calculation as distributed throughout the fractures and solid settling from flowing fluids may be combined in a coupled Algorithm. For example, a two-way coupled algorithm may be used to solve problems 1 and 2 iteratively (as discussed in FIG. 8). The solution of problem 1 determines the slurry velocity in the wellbore. Knowing the slurry velocity and minimum transport velocity the bank areas are evaluated in problem 2 using Eq. 10. Cross sections available for flow may be used in some embodiments to determine the frictional losses in the first algorithm and used to redistribute the flow rates accordingly. In some embodiments, multiple global iterations, such as 3 or more, for example, may be performed depending on the tolerance of the system to error.

EXAMPLES

The following examples, methods in accordance with the present disclosure are used to determine the settling rate of solids for selected systems.

Example 1

In the first example, a method in accordance with the present disclosure is applied to overcome wellbore sanding, in a two cluster interval located in a formation containing layers of varying stresses. The wellbore under study had a horizontal section with an inner diameter (ID) of 5 inches. The lateral section of the well was 300 ft in length with 2 perforation clusters equally spaced, with each perforation cluster contained 6 perforations. The perforation diameter ($d_{perf}$) was 0.38 inches, with a discharge coefficient ($C_d$) of 0.85. The formation was characterized as having a Young's modulus (E) of 4 Mpsi, and a Possion's ratio (v) of 0.2. The height of both fractures is 50 ft. The stimulation uses slickwater with dynamic viscosity (μ) of 5 cP and 100 mesh sand having an average particle diameter ($d_p$) of 0.15 mm with a ratio of particle and fluid densities (s) of 2.65.

The minimum transport velocity in this case is 3.24 ft/s, which corresponds to flow rate 4.7 barrel per minute (BPM) in the wellbore. For this example, the pumping rate into the formation for the samples varied from 0 BPM up to 40 BPM. The closure stress at the first interval was 6000 psi and 6700 psi at the second interval. The results of the simulation are presented in Table 1.

TABLE 1

Cluster flow rate distribution for a formation with two clusters.

| | | 1st cluster | | 2nd cluster | |
|---|---|---|---|---|---|
| Pumping Rate, BPM | Safe/ Unsafe pumping rate | Cluster rate, BPM | Cross-sectional area occupied by sand, % | Cluster rate, BPM | Cross-sectional area occupied by sand, % |
| 2 | Unsafe | 2 | 58 | Closed | — |
| 3 | Unsafe | 3 | 37 | Closed | — |
| 4 | Unsafe | 4 | 16 | Closed | — |

TABLE 1-continued

Cluster flow rate distribution for a formation with two clusters.

| | | 1st cluster | | 2nd cluster | |
|---|---|---|---|---|---|
| Pumping Rate, BPM | Safe/ Unsafe pumping rate | Cluster rate, BPM | Cross-sectional area occupied by sand, % | Cluster rate, BPM | Cross-sectional area occupied by sand, % |
| 5 | Safe | 5 | 0 | Closed | — |
| 6 | Safe | 6 | 0 | Closed | — |
| 9 | Safe | 9 | 0 | Closed | — |
| 10 | Unsafe | 9.9 | 0 | 0.1 | 98 |
| 15 | Unsafe | 14.4 | 0 | 0.6 | 88 |
| 20 | Unsafe | 18.7 | 0 | 1.3 | 72 |
| 30 | Unsafe | 26.6 | 0 | 3.4 | 28 |
| 35 | Unsafe | 30.4 | 0 | 4.6 | 3 |
| 40 | Safe | 34.1 | 0 | 5.9 | 0 |
| >40 | Safe | >34.1 | 0 | >5.9 | 0 |

As demonstrated in Table 1, the first cluster of the two cluster system is the only cluster open at pumping rates of less than 10 BPM. Further, when the pumping rate is below 5 BPM, the cross-sectional area occupied by sand is greater than zero, indicating a pumping regime that is unsafe. Pumping rates in the range of 5 to 9 BPM showed no evidence of sand deposition and were regarded as a safe pumping regime. Pumping rates in the range of 10 to 35 BPM were sufficient to open the second cluster, but also produced a sand bank between first and second cluster intervals and were regarded as unsafe. On the other hand, pumping rates greater that 40 BPM failed to produce sand bank deposition, indicating a safe pumping regime.

Example 2

In the next example, the developed algorithm is used to solve another set of well conditions within a horizontal section having an ID of 5 inches. The lateral was 500 feet in length with 10 perforation clusters equally spaced and a total number of perforations of 60. Diameter $d_{perf}$ was 0.38 inches under a $C_d$ of 0.85. The formation under study possessed an E of 5 Mpsi and a v of 0.2. The height of all the fractures was set to 50 ft. The injected fluid system was slickwater with a μ of 2 cP and contained 20/40 mesh sand having a $d_p$ of 0.5 mm. During testing, the pumping rate varied from 10 BPM up to 90 BPM or 1.5 bpm per perforation. The minimum transport velocity measured was 7 ft/s, which corresponds to a flow rate of 10 BPM in the wellbore.

Figure 9:
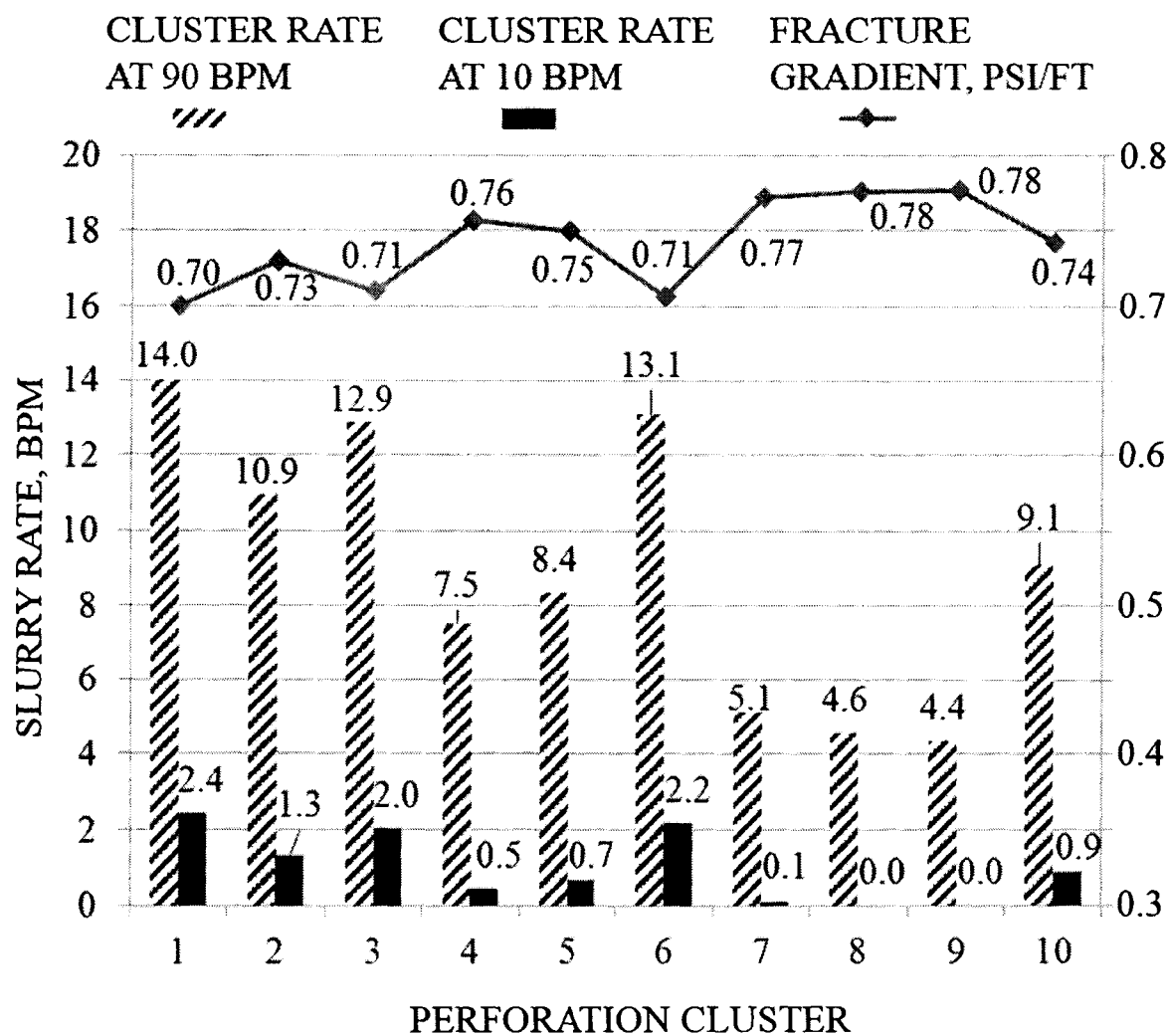
FIG. 9 is graphical depiction of slurry flow rate in the individual perforation clusters of a multi-stage fracturing treatment in accordance with embodiments of the present disclosure.
Figure 10:
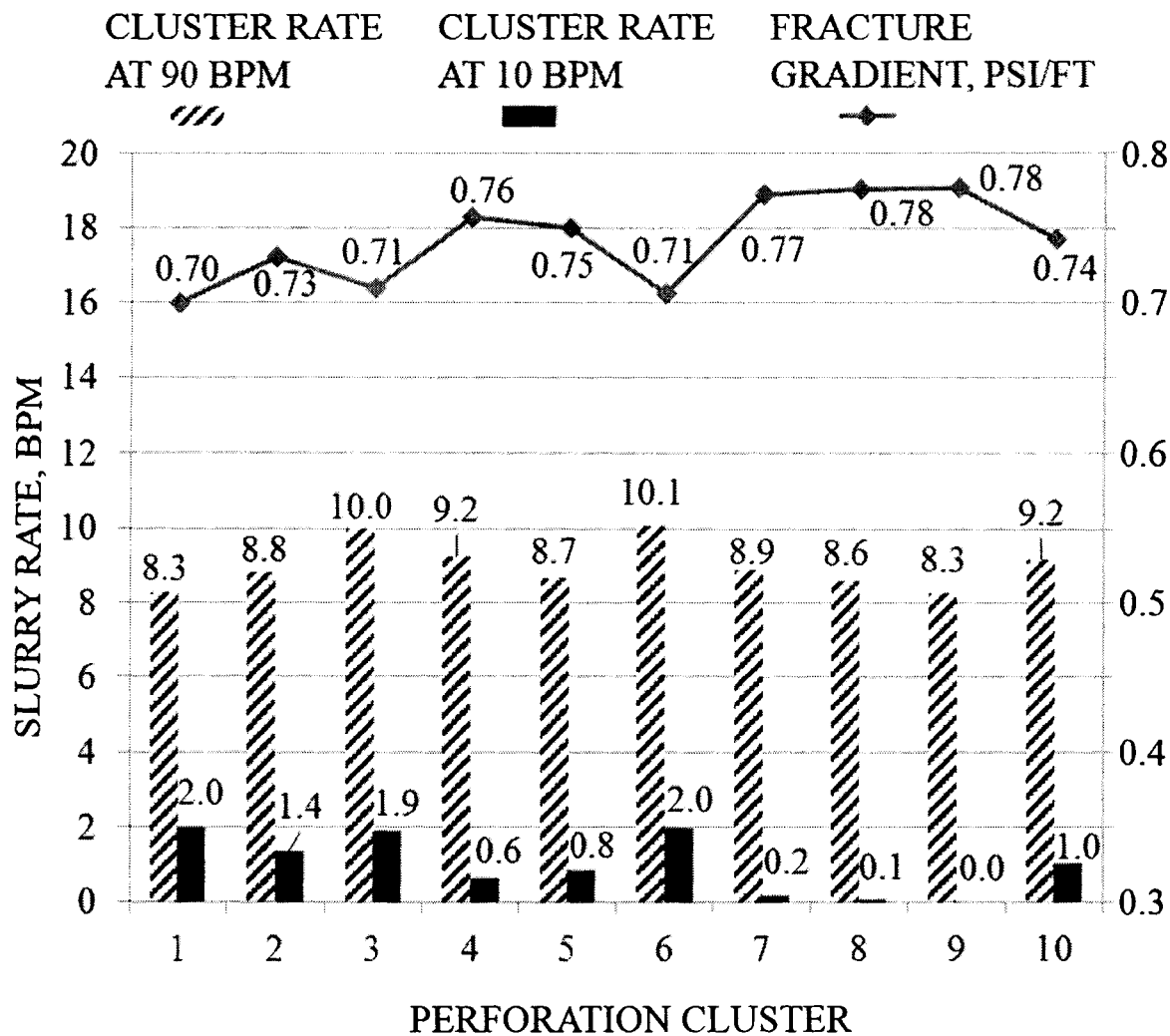
FIG. 10 is graphical depiction of slurry flow rate in the individual perforation clusters of a multi-stage fracturing treatment in accordance with embodiments of the present disclosure.
Figure 11:
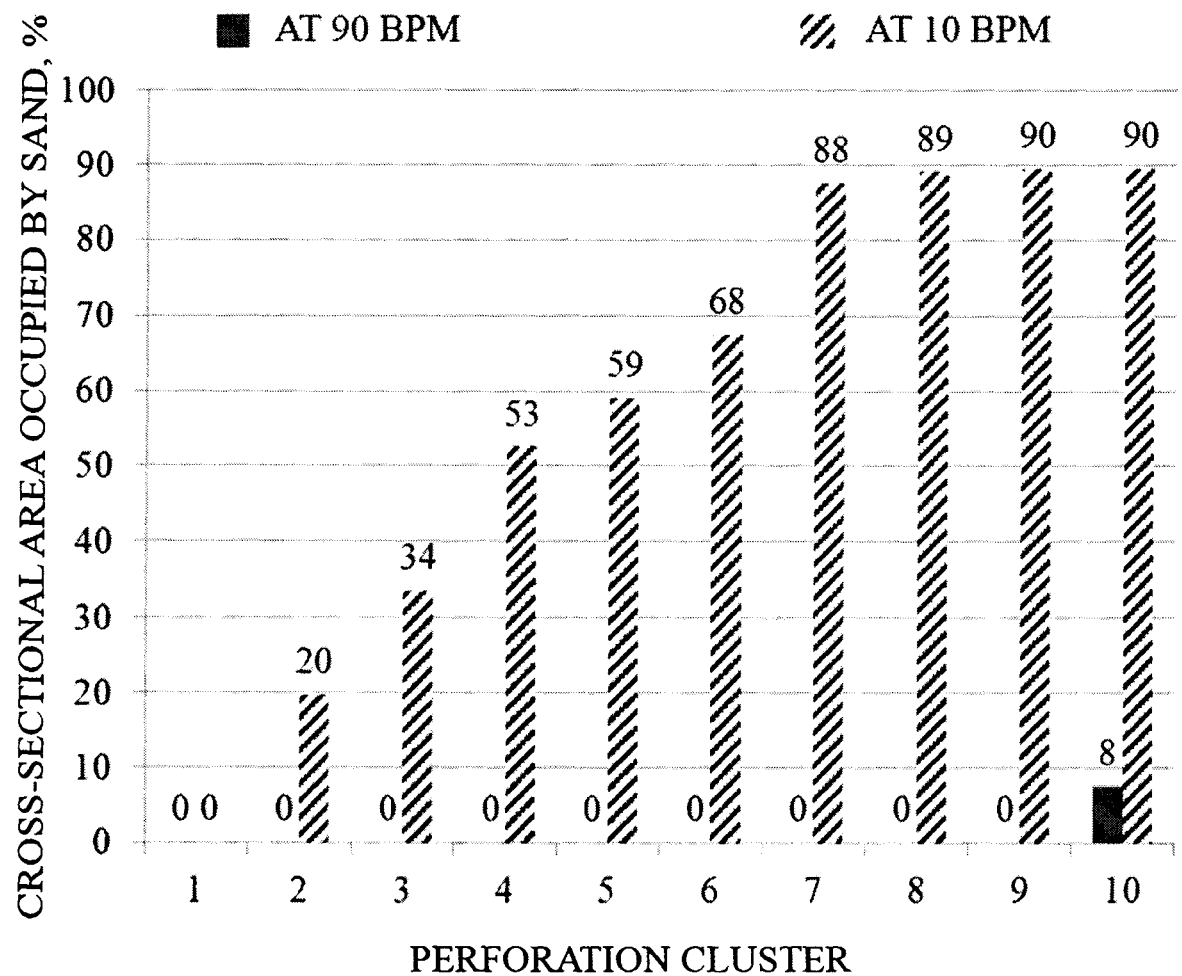
FIG. 11 is graphical depiction of the cross-sectional area of a deposited sand bead for individual perforation clusters of a multi-stage fracturing treatment in accordance with embodiments of the present disclosure.
Figure 12:
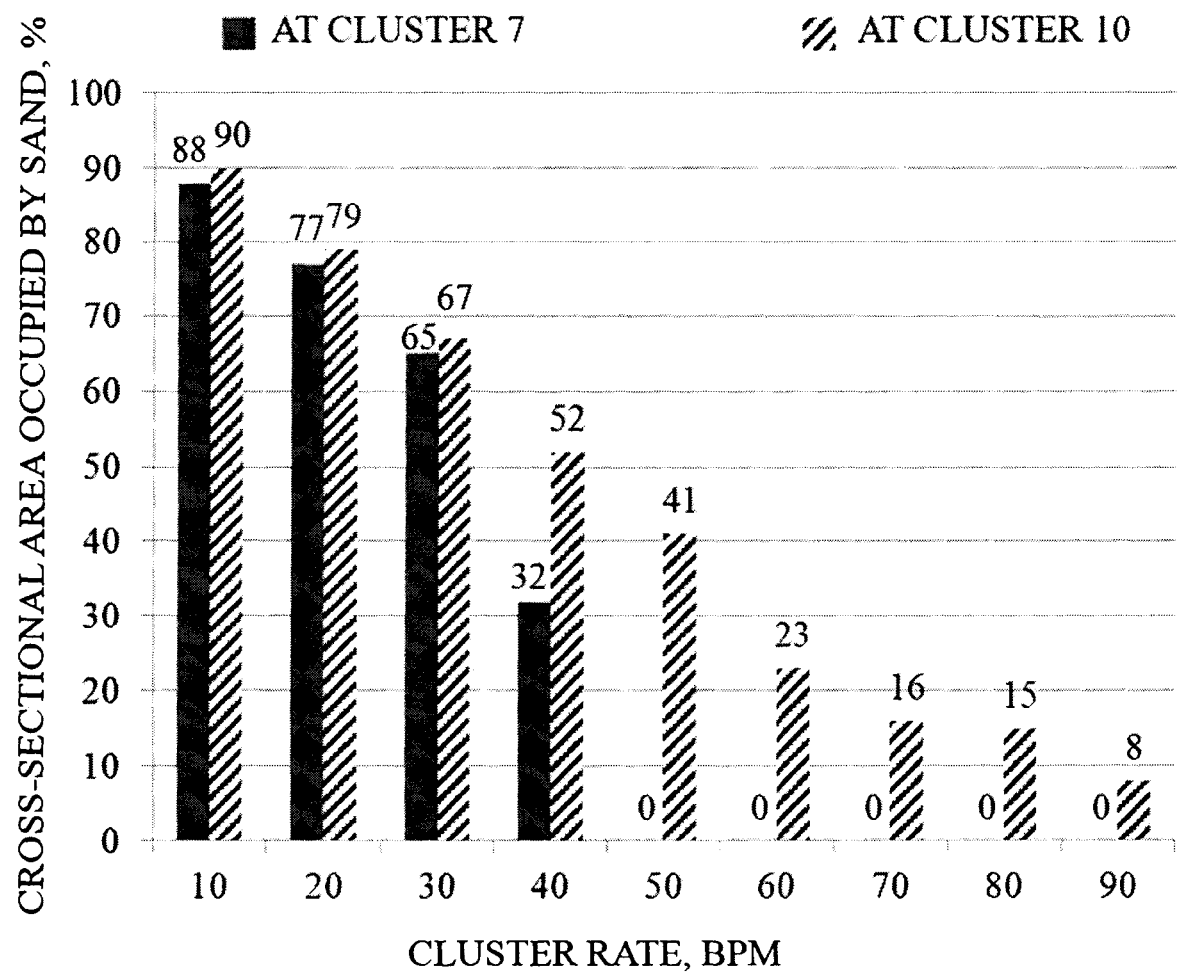
FIG. 12 is a graphical depiction of the cross-sectional area of a deposited sand bed as a function of pumping rate for the tenth and seventh clusters of a fractured interval in accordance with embodiments of the present disclosure.

With particular respect to FIG. 9, the cluster rates for different pumping rates when each perforated intervals with 6 perforations is shown. From FIG. 9, the higher fracture gradient corresponds to the lower flow rate accepted by the fracture. With particular respect to FIG. 10, the number of perforations was adjusted between each perforation cluster in order to approximate a uniform cluster rate distribution, while the total amount of perforations stays the same. With particular respect to FIG. 11, an area of wellbore occupied by a sand bed between perforation clusters is shown, which demonstrates the formation of a small sand bed at the last cluster in the interval at the highest pumping rate. At the lowest pumping rate of 10 BPM, well sanding occurred immediately after the 1st cluster. With particular respect to FIG. 12, the cross-sectional area of the sand bed is shown to correspond to the pumping rate. At 7th cluster, the safe pumping rate is greater than 40 BPM, while at the highest pumping rate of 90 BPM about 8% of wellbore area would be occupied by sand bank.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A method, comprising:
using geometrical and mechanical properties to generate a model of one or more intervals of a deviated wellbore having horizontal sections;
designing a hydraulic fracturing fluid pumping schedule for a wellbore treatment fluid system;
simulating flow of the hydraulic fracturing fluid containing solids using the model of the one or more intervals of the deviated wellbore, wherein simulating flow of the hydraulic fracturing fluid system comprises determining a flow rate distribution within the deviated wellbore and modeling settling and resuspension of the solids within the hydraulic fracturing fluid system, wherein simulating flow of the hydraulic fracturing fluid system within the one or more intervals of the deviated wellbore comprises using an approach comprising Khristianovich-Geertsma-de Klerk (KGD) approach, Perkins-Kern-Nordgren (PKN) approach, radial approach, pseudo 3D approach, or full 3D approach for modeling of inflow into fractures; and
updating the fluid pumping schedule based on an output determined from the simulated flow of the hydraulic fracturing fluid system.

2. The method of claim 1, further comprising executing the fluid pumping schedule to inject the fluid system into the one or more intervals of the deviated wellbore.

3. The method of claim 1, wherein the output determined from the simulated flow of the fluid system comprises determining the degree of solid settling in the one or more intervals of the deviated wellbore.

4. The method of claim 1, wherein designing a pumping schedule comprises determining one or more properties of the fluid system selected from fluid system components and associated concentrations.

5. The method of claim 1, wherein updating the fluid pumping schedule based on the output determined from the simulated flow of the fluid system comprises performing one or more simulations of the flow of a fluid system containing solids within the one or more intervals of the deviated wellbore.

6. The method of claim 1, wherein simulating flow of a fluid system within one or more intervals of a wellbore further comprises determining the critical velocity of the fluid system based on the cross-sectional area occupied by sand.

7. The method of claim 1, wherein the fluid pumping schedule comprises a sequence of pumping stages characterized by a pumping rate of each pumping stage.

8. The method of claim 1, wherein the solids within the simulated fluid system comprise one or more insoluble additives selected from a group consisting of fibers, slices, flakes, fines, colloidal particles, and pulps.

9. The method of claim 1, wherein the simulated fluid system further comprises one or more viscosifying agents selected from a group consisting of guar, xanthan gum, hydroxyethyl cellulose, carboxymethylguar, carboxymethylhydroxypropylguar, and viscosoelastic surfactants.

10. The method of claim 1, wherein the updated fluid pumping schedule defines a fracturing operation.

11. The method of claim 1, wherein the updated fluid pumping schedule defines a refracturing operation or an operation fracturing new perforated clusters within a previously fractured wellbore.

12. A method of formation fracturing, comprising:
using geometrical and mechanical properties of a deviated wellbore having horizontal sections, and piping to generate a model of one or more intervals of the deviated wellbore;
simulating flow of a fracturing fluid containing one or more of solids and additives within the one or more intervals of the deviated wellbore, wherein simulating flow of the fracturing fluid comprises determining a flow rate distribution within the deviated wellbore and modeling settling and resuspension of the one or more solids and additives within the fracturing fluid, wherein simulating flow of the fracturing fluid within the one or more intervals of the deviated wellbore comprises using an approach comprising Khristianovich-Geertsma-de Klerk (KGD) approach, Perkins-Kern-Nordgren (PKN) approach, radial approach, pseudo 3D approach, or full 3D approach for modeling of inflow into fractures;
determining a critical velocity of the fracturing fluid system for various concentrations of the one or more of solids and additives;
selecting a concentration of the one or more of solids and additives to ensure a flow velocity in the deviated wellbore that is higher than the determined critical velocity; and
performing a fracturing operation with the simulated flow rate distribution and concentrations of solids and additives in the fracturing fluid.

13. The method of claim 12, further comprising injecting the fluid system containing one or more of solids and additives into the deviated wellbore within a subterranean formation using the concentration of the one or more of solids and additives based on the critical velocities selected.

14. The method of claim 12, wherein the selected concentration of the one or more solids and additives is used to construct a fluid pumping schedule comprising a sequence of pumping stages characterized by at least the pumping rate of each pumping stage.

15. The method of claim 12, wherein the solids within the simulated fluid system comprise one or more selected from a group consisting of fibers, slices, flakes, fines, colloidal particles, and pulps.

16. The method of claim 12, wherein the simulated fluid system further comprises one or more viscosifying agents selected from a group consisting of guar, xanthan gum, hydroxyethyl cellulose, carboxymethylguar, carboxymethylhydroxypropylguar, and viscosoelastic surfactants.

17. The method of claim 12, wherein simulating further comprises calibrating the model of flow of the fluid system against one or more critical velocities measured for different flow rates and concentrations of additives.

* * * * *